United States Patent [19]

Berg

[11] Patent Number: 4,567,445
[45] Date of Patent: Jan. 28, 1986

[54] HIGH INPUT IMPEDANCE LOW OUTPUT IMPEDANCE AMPLIFIER

[75] Inventor: Bengt O. Berg, Solna, Sweden

[73] Assignee: Telefonaktiebolaget LM Ericsson, Stockholm, Sweden

[21] Appl. No.: 616,212

[22] PCT Filed: Oct. 19, 1983

[86] PCT No.: PCT/SE83/00355
§ 371 Date: May 18, 1984
§ 102(e) Date: May 18, 1984

[87] PCT Pub. No.: WO84/01678
PCT Pub. Date: Apr. 26, 1984

[30] Foreign Application Priority Data

Oct. 20, 1982 [SE] Sweden .............................. 83/00355
Oct. 20, 1982 [SE] Sweden .............................. 8205967

[51] Int. Cl.[4] ............................................. H03F 3/16
[52] U.S. Cl. .................................... 330/300; 330/289
[58] Field of Search ................ 330/288, 289, 296, 300

[56] References Cited

U.S. PATENT DOCUMENTS 4,482,868 11/1984 Whatley .............................. 330/300

Primary Examiner—James B. Mullins
Assistant Examiner—G. Wan
Attorney, Agent, or Firm—Roberts, Spiecens & Cohen

[57] ABSTRACT

An amplifier circuit with high input impedance and low output impedance intended for being supplied with current via the output signal line includes a pre-amplifier with a transistor of the field-effect type (Q12) and a bipolar transistor (Q13) directly connected thereto, where the base-emitter circuit of the bipolar transistor and the source-drain circuit of the field-effect transistor (Q12) are connected in series across the supply source. The gate of the field-effect transistor is connected to a biasing source (16), the temperature coefficient of which has substantially the same absolute value as the temperature coefficient of the base-emitter voltage in the bipolar transistor (Q13), but with reverse sign.

2 Claims, 1 Drawing Figure

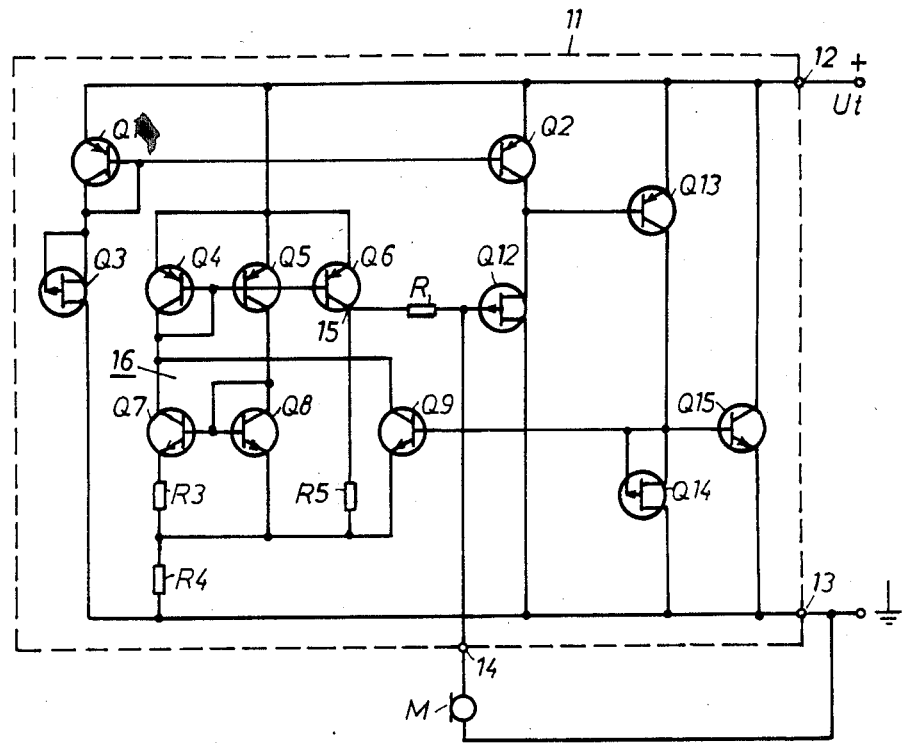

HIGH INPUT IMPEDANCE LOW OUTPUT IMPEDANCE AMPLIFIER

TECHNICAL FIELD

The invention relates to an amplifier circuit with high input impedance and low output impedance, preferably intended as a microphone amplifier in telephone apparatus with electret microphones and for being supplied with current via the telephone line.

BACKGROUND ART

Electret microphones are used to an ever-increasing extent in modern telephone apparatus, since they give good sound quality, have low power consumption and are inexpensive in manufacture. As with all electrostatic microphones, the electret microphone has a very high impedance and low output power, so an amplifier must therefore be connected between the microphone and the line. Due to the electret microphone's high impedance, this amplifier should be immediately adjacent the microphone to avoid circuit noise. Suitably, the microphone and amplifier are built together to a capsule which is placed in the telephone handset. Current supply then suitably takes place using the same conductor as for the signals from the handset to the telephone set. A suitable circuit for connecting a source having very high impedance to a load with low impedance suitably contains an input stage with a field-effect transistor directly connected to one or more emitter follower stages. Such circuits are known in the literature e.g. from "Electronics" Feb. 28, 1972, page 80, which illustrates an amplifier for a capacitive transducer.

DISCLOSURE OF INVENTION

When an amplifier of this kind is to be used as a microphone amplifier, large demands are placed on it for operation at low voltages (lower than 2 volts) and within a large temperature range ($-20°-+70°$ C.) with low distorsion.

For the field-effect transistor to work linearly at constant bias over the whole temperature range the bias must be made high, due to the threshold voltage increasing with the temperature. At low temperatures, the sum of this voltage and the voltage, increasing with falling temperature, of the base-emitter voltage in the emitter follower stage will then be so large that there is the risk of the voltage of the amplifier current supply circuit not being sufficient. The field-effect transistor has, however, the property that it does not need such a high voltage at low temperatures, due to the threshold voltage having a positive temperature coefficient.

In accordance with the invention, this relationship can be utilized for optimally utilizing available supply voltage in an amplifier circuit with one input stage having at least one field-effect transistor directlyg connected to a bipolar amplifier stage. The characterizing features of the invention are disclosed in the accompanying claims.

DESCRIPTION OF FIGURE

The invention will now be described in detail in conjunction with the appended drawing whose sole FIGURE, illustrates a circuit diagram for an electret microphone amplifier.

PREFERRED EMBODIMENT

An integrated amplifier, denoted by the numeral 11 in the sole FIGURE, has only three exterior connections, namely 12, which is a common signal output and positive voltage supply, a common point 13 for the amplifier input and output (earth) as well as negative voltage supply, and the signal input 14. An electret microphone M is connected between the signal input 14 and earth 13. The integrated circuit is built up conventionally with a p substrate and an epitaxial n layer, wherein transistors and other elements have been made using the diffusion technique.

The input stage of the amplifier consists of a field-effect transistor Q12 of the P channel type, with its gate connected to the input 14. This transistor Q12 is fed with current from a current mirror circuit including the transistors Q1, Q2 and the field-effect transistor Q3. The field-effect transistor Q3, which is exactly equal to the field-effect transistor Q12, is connected as a constant current generator supplying the diode-connected transistor Q1. The current in transistor Q1 is reflected to the identically similar transistor Q2 driving the same current through the field-effect transistor Q12. The transistor Q2 shall operate linearly.

The drain of the field-effect transistor Q12 is directly connected to the base of the emitter follower stage Q13, the collector of which gets its current supply from the field-effect transistor Q14. The collector of the transistor Q13 is directly connected to the base of the n-p-n transistor Q15, the emitter-collector circuit of which is directly connected to the supply lines 12, 13. The transistors Q13 and Q14 may be considered together as an emitter follower stage with high current amplification.

The gate of the field effect transistor Q12 is connected via a very high resistance R to the output 15 from a reference voltage source 16 of the bandgap reference type. The bandgap reference source 16 consists of the transistors Q4, Q5, Q6, Q7 and Q8 conventionally disposed in a current mirror circuit. The transistors Q7 and Q8 are of different sizes and therefore have different current densities for the same current. In the embodiment, Q7 is the transistor which has the greatest area. The transistors Q4, Q5 and Q6 are of the same size, and with the aid of the current mirror they carry the same current. Due to the lower current density in the transistor Q7, this will have a lower base-emitter voltage. The difference in the base-emitter voltage between the transistors Q7 and Q8 is obtained across the resistor R3 in the emitter circuit.

The reference current of the bandgap reference gives rise to an equally as great current through the transistor Q6, the collector of which is connected to earth through the resistors R5 and R4. The voltage drop across these resistors is taken out as the reference voltage at the point 15 and constitutes the bias to the field-effect transistor Q12 in the input stage of the amplifier. When the voltage supply is connected to the bandgap reference source 16, no current flows to either of the transistors Q7 and Q8, and it can therefore not be excited. In order to enable excitation, the transistor Q9 is connected in parallel with the transistor Q7 and the resistor R3. The base of the transistor Q9 is connected to the collector of the transistor Q13. At the connection instant the transistor Q13 momentarily has the base voltage zero and is heavily conducting. The base of the transistor Q15 becomes positive and the transistor Q9 will be conducting. The transistor Q4 will be conducting and current begins to flow in the bandgap reference source 16. The potential drop across resistor R4 cuts off transistor Q9.

As mentioned above, the emitter of the field-effect transistor Q12 will obtain a voltage falling by a base-emitter potential drop below the supply voltage on the supply line 12. The same voltage also appears at the gate of Q12 due to the current mirror circuit Q3, Q1, Q2. The identical field-effect transistor Q3 namely has source and gate interconnected.

The base-emitter voltage of a bipolar transistor has a temperature coefficient of $-2$ mV/°C. With the present circuit, where the amplifier has to operate between $-20°$ C. and $+70°$ C., it is required that the base-emitter voltage is considerably raised in the bipolar transistor Q13 to enable maintenance of the collector current, and thereby the amplification even at low temperatures. This means that the field effect transistor Q12 must be satisfied with a lower source-drain voltage, if the total supply voltage across the circuit cannot increase. A field-effect transistor has, however, a positive temperature coefficient for the pinch-off voltage Vp. It is therefore possible to dimension the bias at point 15 so that it obtains a positive temperature coefficient. By suitable selection of this positive temperature coefficient, it is possible to utilize the properties of the field effect transistor such that both amplifier stages are given substantially constant amplification at acceptably low distortion over the entire temperature range. At low temperatures the transistor Q13 obtains a higher proportion of the available supply voltage, while the field-effect transistor, which has better data at lower temperatures, must be satisfied with a lower proportion. The reverse condition applies at higher temperatures.

The temperature control of the bias at point 15 is provided by selecting the temperature coefficient of the badgap reference source 16. Here the temperature coefficient is determined by the temperature coefficient of the resistor R3, plus the temperature coefficient of the difference in the base-emitter voltage between the transistors Q8 and Q7. These parameters are suitably set such that the temperature coefficient of the voltage at point 15 is of the same order of magnitude as for the base-emitter voltage in the transistor Q13, but with reversed sign, i.e. about $+2$ mV/°C.

I claim:

1. An amplifier circuit powered by a low supply voltage source including an amplifier with a field-first effect transistor, a bipolar transistor and means for interconnecting the first field-effect transistor and the bipolar transistor to the low supply voltage source in such a manner that the base-emitter circuit of the bipolar transistor and the source-drain circuit of the first field-effect transistor are connected in series across the low supply voltage source, the improvement comprising that the first field-effect transistor is included in the first branch of a current mirror circuit also having an identical second branch which is a current generator branch including a second field-effect transistor identical to said first field-effect transistor, the gate of said second field-effect transistor being directly to the source of said second field-effect transistor, whereby the drain of said first field-effect transistor always follows the gate of said second field-effect transistor, and that the gate of the first field-effect transistor is connected to a biasing means having a temperature coefficient with the same absolute value but opposite in sign as the temperature coefficient of the base-emitter voltage of the bipolar transistor.

2. The amplifier circuit of claim 1 wherein the biasing source comprises a bandgap reference voltage source.

* * * * *